(12) United States Patent
Fang et al.

(10) Patent No.: US 9,830,978 B2
(45) Date of Patent: Nov. 28, 2017

(54) WRITE-TRACKING CIRCUIT FOR MEMORY

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Wei Fang, Beijing (CN); Zengbo Shi, Beijing (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/359,587

(22) Filed: Nov. 22, 2016

(65) Prior Publication Data

US 2017/0287552 A1    Oct. 5, 2017

(30) Foreign Application Priority Data

Apr. 5, 2016  (CN) .......................... 2016 1 0206121

(51) Int. Cl.
*G11C 11/00*    (2006.01)
*G11C 11/419*    (2006.01)

(52) U.S. Cl.
CPC .................................. *G11C 11/419* (2013.01)

(58) Field of Classification Search
CPC .................................................. G11C 11/419

USPC .......................................................... 365/154
See application file for complete search history.

(56) References Cited

U.S. PATENT DOCUMENTS

| | | | |
|---|---|---|---|
| 6,483,754 B1 | 11/2002 | Agrawal | |
| 7,411,813 B2 * | 8/2008 | Maki | G11C 11/412 365/154 |
| 7,499,347 B2 * | 3/2009 | Chen | G11C 7/14 365/194 |
| 8,570,789 B2 * | 10/2013 | Chang | G11C 11/413 365/138 |
| 8,630,135 B2 * | 1/2014 | Douzaka | G11C 7/08 365/189.08 |
| 2006/0120142 A1 | 6/2006 | Yamagami | |

OTHER PUBLICATIONS

European Application No. 17163584.0, Extended European Search Report date on Aug. 24, 2017, 8 pages.

* cited by examiner

*Primary Examiner* — Tha-O H Bui
(74) *Attorney, Agent, or Firm* — Kilpatrick Townsend & Stockton LLP

(57) ABSTRACT

A write tracking circuit includes a dummy memory cell coupled to a first dummy bit line, a second dummy bit line, and a dummy word line, a logic operation unit coupled to the dummy word line and to the first dummy bit line and configured to output a write feedback signal based on a logic operation of a signal on the dummy word line and a signal on the first dummy bit line, and a delay unit coupled to the dummy memory cell at a storage node. The write tracking circuit provides a correct feedback signal to the clock generation module to ensure normal operation of the peripheral circuit, when a data write operation to the dummy memory cell failed.

20 Claims, 4 Drawing Sheets

WRITE-TRACKING CIRCUIT FOR MEMORY

CROSS-REFERENCES TO RELATED APPLICATIONS

This application claims priority to Chinese patent application No. 201610206121.0, filed on Apr. 5, 2016, the content of which is incorporated herein by reference in its entirety.

FIELD OF THE INVENTION

The present invention relates generally to integrated circuits. More particularly, embodiments of the present invention relate to write-tracking circuitry and a memory including a write tracking circuit for writing data to a memory cell.

BACKGROUND OF THE INVENTION

As semiconductor processing technology advances, the feature sizes of devices in a semiconductor memory integrated circuit become smaller, the operating speed of the devices becomes faster while the power consumption is reduced. In semiconductor devices at nanometer scales, variations in process, supply voltage, temperature (PVT), and other adverse factors may cause various deviations of the same transistor from the original design. The process deviation has a significant impact on a device performance and increases the difficulty level of a complete circuit simulation. Process variations cause different memory cells to have different speeds for write and read operations, resulting in timing inconsistency. Variations in supply voltage and temperature may further cause timing differences which adversely affects the correct read and write operations of a memory.

Static random access memories (SRAMs) are widely used as volatile memory in computers, mobile phones and other electronic products. In general, the SRAM read speed is slower than the write speed, thus, more attention is paid to tracking the timing of the data read path. As the integration level and power consumption requirements are higher, the supply voltage also decreases. At lower supply voltages, the SRAM write speed also decreases, in addition to the worst case process condition, if the data write delay is not considered, the effective time of the signal available on a word line or bit line may not be sufficient to complete a write operation successfully, ultimately resulting in a lower yield of the SRAM. Therefore, there is a need for a novel write tracking circuit to improve the timing accuracy and reliability of an SRAM.

BRIEF SUMMARY OF THE INVENTION

Embodiments of the present invention provide a novel write tracking circuit that can provide a correct feedback signal to the clock generation module to ensure a normal operation of the peripheral circuit when a write operation to a dummy memory cell failed.

In some embodiments, a write tracking circuit may include a dummy memory cell coupled to a first dummy bit line, a second dummy bit line, and a dummy word line, a logic operation unit coupled to the dummy word line and to the first dummy bit line and configured to output a write feedback signal based on a logic operation of a signal on the dummy word line and a signal on the first dummy bit line, and a delay unit coupled to the dummy memory cell at a storage node.

In one embodiment, the delay unit may include a first inverter having an input terminal coupled to the storage node and an output terminal, a first logic unit having a first input terminal coupled to the output terminal of the first inverter, a second input terminal for receiving the write feedback signal, and an output terminal, and a second inverter having an input terminal coupled to the output terminal of the first logic unit and an output terminal for outputting a feedback signal.

In one embodiment, the logic operation unit may include a second logic unit having a first input terminal coupled to the dummy word line, a second input terminal coupled to the first dummy bit line and an output terminal for outputting an operation signal based on a logic operation of the signal on the dummy word line and the signal on the first dummy bit line, and a sub-delay unit having an input terminal for receiving the operation signal and an output terminal for outputting the write feedback signal.

In one embodiment, the sub-delay unit may include a plurality of series-connected inverters. In one embodiment, the plurality of series-connected inverters include even-number CMOS standard inverters.

In one embodiment, each of the first logic unit and the second logic unit is a NAND gate.

In one embodiment, the dummy memory cell includes a pair of cross-coupled inverters having a first storage node and a second storage node, a first pass transistor operatively coupled to the first storage node, and a second pass transistor operatively coupled to the second storage node, the second storage node being the storage node to which the delay unit is connected to the dummy memory cell.

In one embodiment, the dummy memory cell is coupled to the first dummy bit line through the first pass transistor and to the second dummy bit line through the second pass transistor, and the first and second pass transistors are controlled by the dummy word line.

In one embodiment, the write tracking circuit further includes a test unit configured to determine a write operation state of the dummy memory cell. For example, the write operation state may indicate whether a data write operation to the dummy memory cell was successful or has failed. In one embodiment, the test circuit includes a NOR gate having first and second input terminals coupled to the first and second input terminals of the first logic unit, which is a two-input NAND gate.

Embodiments of the present invention also provide a memory including a write tracking circuit. The write tracking circuit includes a dummy memory cell coupled to a first dummy bit line, a second dummy bit line, and a dummy word line, a logic operation unit coupled to the dummy word line and to the first dummy bit line and configured to output a write feedback signal based on a logic operation of a signal on the dummy word line and a signal on the first dummy bit line, and a delay unit coupled to the dummy memory cell at a storage node.

In accordance with the present invention, the write tracking circuit may provide a correct feedback signal to the clock generation module to ensure normal operation of the peripheral circuit when a data write operation to a dummy memory cell failed.

The following description, together with the accompanying drawings, will provide a better understanding of the nature and advantages of the claimed invention.

DETAILED DESCRIPTION OF THE INVENTION

Figure 1:
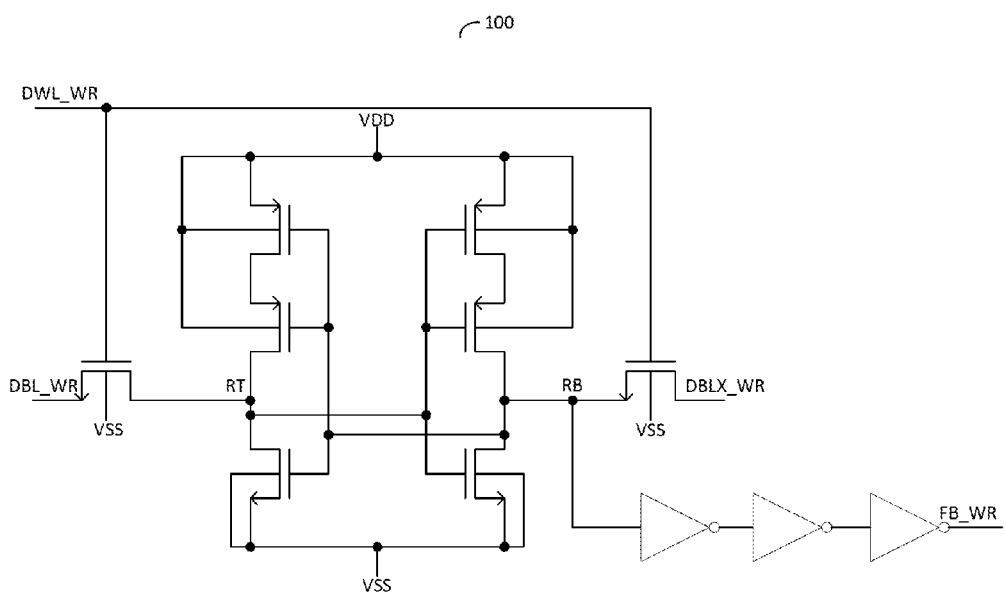
FIG. 1 is a simplified schematic diagram of a conventional write tracking circuit.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Recently, SRAM are widely used due to their high speed and simple operations. Generally, an SRAM array includes a tracking circuit for tracking a delay of a test signal transmitted to the SRAM array. In order to ensure a sufficient long read time duration period, i.e., to ensure the correct data reading of the memory cell, the timing of the control signal of the memory cell is adjusted using the delay obtained from the tracking circuit. The performance and reliability of the SRAM can thus be greatly improved.

Generally, the data read speed of an SRAM is slower that the data write speed, thus, attention is paid on the design of tracking the timing of the data read path. As the integration level and power consumption requirements are higher, the supply voltage also decreases. At low supply voltages, the SRAM write speed also decreases, and under worst case process conditions, if the data write delay is not considered, the effective time period of a signal supplied to a word line or bit line may not be sufficient to complete a successful write operation, ultimately resulting in a lower yield of the SRAM.

In early SRAMs, read/write cycle self-timing control uses a same tracing path that is a reading replica circuit. However, under the minimum operating voltage (Vccmin) condition, the write operation in an SRAM requires a longer time duration than the read operation on a word line. Therefore, the design of an individual write tracking circuit has become mainstream.

Write tracking circuits of early SRAMs were implemented using a delay chain, or they were implemented using read tracking circuits with an additional delay chain. These implantations have the drawbacks of not being able to adapt to process, supply voltage and temperature (PVT) variations.

Currently, a write tracking circuit is implemented using a replica of a memory bit cell of a SRAM (array) having a plurality of memory bit cells. The method can replicate a write operation, however, under the minimum operating voltage (Vccmin) condition, the failure of a write operation to a dummy memory bit cell may cause the tracking circuit to fail. FIG. 1 shows a simplified schematic diagram of a conventional write tracking circuit 100. As shown in FIG. 1, the write tracking circuit 100 includes a dummy cell having an 8-transistor cell structure, the series-connected pull-up transistors improve the write performance and reduce Vccmin to some extent. However, when Vccmin decreases further, the storage nodes RT/RB cannot be "flipped", resulting in an error in the feedback signal FB_WR. This results in a deadlock signal that cannot be recovered in the clock generation module, leading to a failure of a peripheral circuit.

In order to overcome the above-described problems, embodiments of the present invention provide a write tracking circuit including a dummy memory bit cell and a delay element connected to a storage node of the dummy memory bit cell (alternatively referred to as dummy cell or memory dummy cell). The dummy cell is coupled to a first dummy bit line, a second dummy bit line, and a dummy word line. A write feedback signal that serves as a delay element is introduced. The write feedback signal is generated based on a result of a logic operation between a signal on the dummy word line and a signal on the first dummy bit line of the dummy memory bit cell. The path delay of the generated write feedback signal is made larger than the tracking time duration of the dummy cell. As the Tdelay path only uses digital logic circuits, it has a much lower operating voltage Vmin, so that the Tdelay path can provide the correct falling of FB_WR. Thus, when a write operation to the dummy cell failed, the nodes RB/RT do not flip (the nodes do not change states), RB remains "0", RBB remains "1", and Tdelay transits from "1" to "0", this ensures that a correct feedback signal is provided to the clock generation module, enabling a normal operation of the peripheral circuit. A write tracking circuit structure will be described in detail below according to one embodiment of the present invention.

In one embodiment, a write tracking circuit includes a dummy memory cell (dummy cell) and a delay element connected to a storage node of the dummy memory cell.

The dummy cell may have the same structure as the memory bit cell to obtain an accurate replica of the actual write time. For example, the dummy cell may include a pair of cross-coupled inverters having a first storage node and a second storage node, a first pass transistor operatively connected to the first storage node, and a second pass transistor operatively connected to the second storage node. The dummy cell is operatively connected to a dummy bit line (e.g., a first dummy bit line) associated with the dummy cell through the first pass transistor, the dummy cell is also operatively connected to another dummy bit line (e.g., a second dummy bit line) associated with the dummy cell through the second pass transistor. The first and second pass transistors are controlled by a dummy word line associated with the dummy cell.

In one embodiment, the delay unit includes a first inverter, a first logic unit, and a second inverter. In an exemplary embodiment, the first logic unit is a NAND gate. The second inverter has an input terminal connected to the second storage node of the dummy cell. The first inverter has an output terminal connected to a first input terminal of the first logic unit, the second inverter has an output terminal that outputs the write feedback signal of the write tracking circuit.

The write feedback signal is generated based on a result of a logic operation of a signal on the dummy word line associated with the dummy cell and a signal on the first dummy bit line. Specifically, the delay unit may further include a second logic unit and a sub-delay unit. Alternatively, the write tracking circuit includes a logic operation unit including a second logic unit and a sub-delay unit. In one embodiment, the second logic unit includes first and second input terminals connected to the first dummy word line and the first dummy bit line, respectively. The second logic unit includes an output terminal connected to the input terminal of the sub-delay unit, the sub-delay unit has an output terminal outputting the write feedback signal.

When the write operation to the dummy cell failed, it is possible to ensure a correct feedback signal that is provided to the clock generation module based on the write feedback signal, thereby ensuring the normal operation of the peripheral circuit. In an exemplary embodiment, the second logic unit is a NAND gate.

In an exemplary embodiment, the sub-delay unit may include a plurality of series-connected inverters, and the number of series-connected inverters may be chosen according to system requirements. In one embodiment, the sub-delay unit may include an even number of CMOS standard inverters connected in series.

Further, the write tracking circuit may also include a test circuit configured to determine whether there is a failure in the write operation to the dummy cell. In an exemplary embodiment, the test circuit may include a NOR gate having first and second input terminals that receive the same signals as those of the first and second input terminals of the first logic unit, i.e., the two signals at the first and second input terminals of the NOR gate are the output signal of the first inverter RBB and the write feedback signal denoted "Tdelay" (see FIG. 2). The output signal (denoted "Test_error") of the NOR gate indicates whether the dummy cell has a write operation failure. Based on the test circuit, the write operation failure of the dummy cell can be timely fed back to the system including the SRAM.

Figure 2:
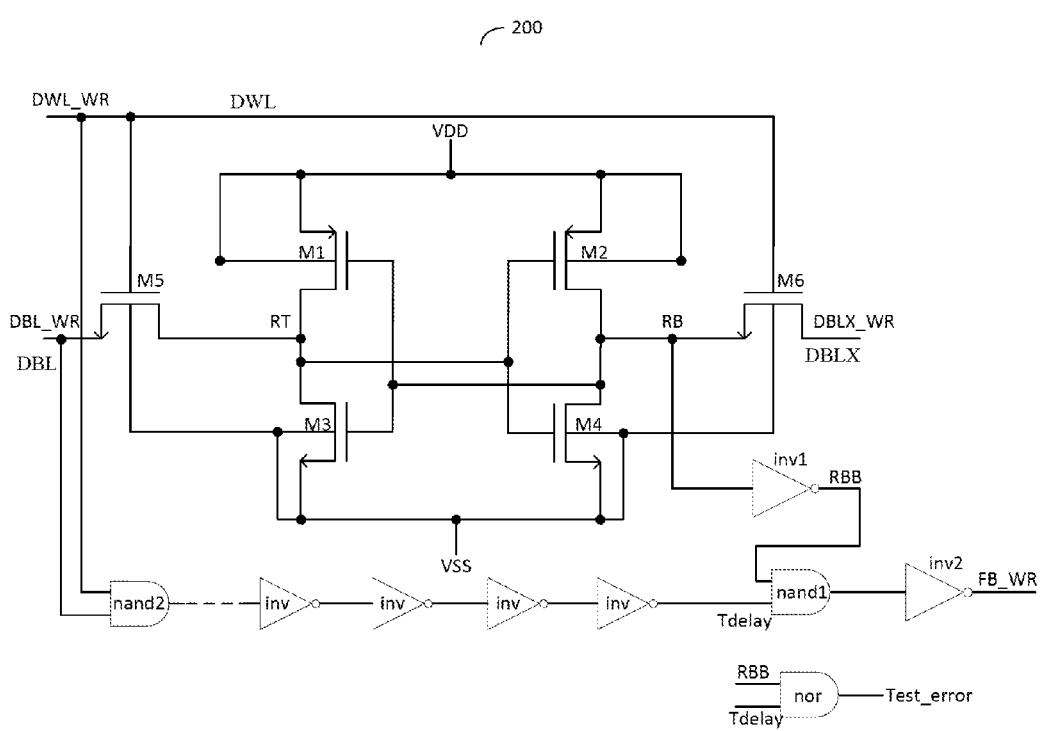
FIG. 2 is a simplified schematic diagram of a write tracking circuit according to one embodiment of the present invention.

The write tracking circuit according to one embodiment of the present invention will be described in detail below. FIG. 2 shows a simplified schematic diagram of a write tracking circuit 200 according to one embodiment of the present invention. As shown in FIG. 2, write tracking circuit 200 includes a dummy cell and a delay unit.

The dummy cell includes a pair of cross-coupled inverters formed with transistors M1, M2, M3, and M4, and a first storage node RT and a second storage node RB. M1 and M3 form an inverter and M2 and M4 form another inverter of the pair of cross-coupled inverters. The dummy cell also includes a first pass transistor M5 operatively coupled to the first storage node RT and a second pass transistor M6 operatively coupled to the second storage node RB. Write tracking circuit 200 further includes a dummy word line DWL associated with the dummy cell and a pair of dummy bit lines DBL and DBLX.

The delay unit includes a first inverter inv1, a first logic unit, and a second inverter inv2. For example, the first logic unit is a NAND gate denoted "nand1", as shown in FIG. 2.

The first inverter inv1 has an input terminal connected to the storage node RB. The output terminal of the first inverter inv1 is connected to an input terminal (e.g., a first input terminal) of the nand1 gate, i.e., the output signal RBB of the first inverter inv1 is provided to the first input terminal of the nand1 gate.

The other input terminal (e.g., the second input terminal) of the nand1 gate is supplied with the write feedback signal denoted "Tdelay". The write feedback signal Tdelay is generated from the result of the logic operation between the signal DWL_WR on the dummy bit line DWL and the signal DBL_WR on the dummy bit line DBL.

Referring to FIG. 2, the write feedback signal Tdelay is generated from the second logic unit and the sub-delay unit. The second logic unit is the nand2 gate. The signals DWL_WR and DBL_WR are supplied to the nand2 gate and the sub-delay unit including a number of series-connected inverters. The number of in series connected inverters can be determined according to system requirements. The output signal of the sub-delay unit is the write feedback signal Tdelay.

The output terminal of the first logic unit nand1 is connected to the input terminal of the second inverter inv2, the output signal FB_WR of the second inverter inv2 is the feedback signal of the write tracking circuit 200.

In addition, the write tracking circuit 200 may also include a test unit according to one embodiment of the present invention. The test unit can be used to determine whether there is a write operation failure to the dummy cell. Illustratively, the test unit is the 2-input NOR gate "nor". The nor gate has first and second input terminals configured to receive the same signals as the first logic unit nand1, i.e., the signal RBB outputted by the first inverter inv1 and the write feedback signal Tdelay outputted by the sub-delay unit. The output signal Test_error of the nor gate indicates whether a write operation failure has occurred in the dummy cell.

The operation of the write tracking circuit 200 is described below in further detail.

The dummy cell is a special dummy memory bit cell that can store a predetermined logic state. For example, the first storage node RT has an initial logic state "1", the second storage node RB is preset to a logic state "0". When the signal DWL_WR on the dummy word line DWL is logic 1 and the signal DBL_WR on the dummy bit line DWL transitions from 1 to 0, in the normal operation, the first storage node RT transitions from 1 to 0, and the second storage node RB transitions from 0 to 1, and the feedback signal FB_WR of the circuit transitions from 1 to 0.

When a write operation has failed in the dummy cell, the second storage node RB cannot change it logic state (cannot flip), so that the second storage node RB remains low, i.e., the signal RBB remains high. In this case, the write delay signal Tdelay causes the feedback signal FB_WR to transition from 1 to 0, in accordance with embodiments of the present invention. In other words, due to the write feedback signal Tdelay, in the occurrence of the write operation failure in the dummy cell, the write tracking circuit 200 can provide a correct feedback signal to the clock generator module to ensure the normal operation of the peripheral circuit. Thus, the write tracking circuit 200 according to the present invention can solve the problem of incorrect feedback signal FB_WR caused by the incapability of logic state change ("flipping") of the storage node in the dummy cell at a minimum operating voltage Vccmin, the incapability of the logic state change causes a deadlock signal that prevents the restoration of the clock generation module. When input CLK transits from low to high, the SRAM will turn to self-lock status and changes of all of external input pins (input terminals) will be ignored. This self-lock status will not be changed until the internal reset signal turns to "0". As to the conventional circuit 100, when the dummy cell write operation failed, i.e., nodes RT/RB do not change states (i.e., they do not flip), RB remains "0", and FB_WR remains "1", the internal reset signal will always keep "1", and the SRAM will be deadlock, so that the peripheral circuit cannot operate normally.

The Test_error signal of the test unit indicates whether there is a failure in the write operation to the dummy cell. For example, when the dummy cell operates correctly, the signal Test_error is asserted high ("1") when both signals Tdelay and RBB are 0. When Test_error remains at 0, the write tracking circuit informs the system that there is a write operation failure to the dummy cell.

Figure 3A:
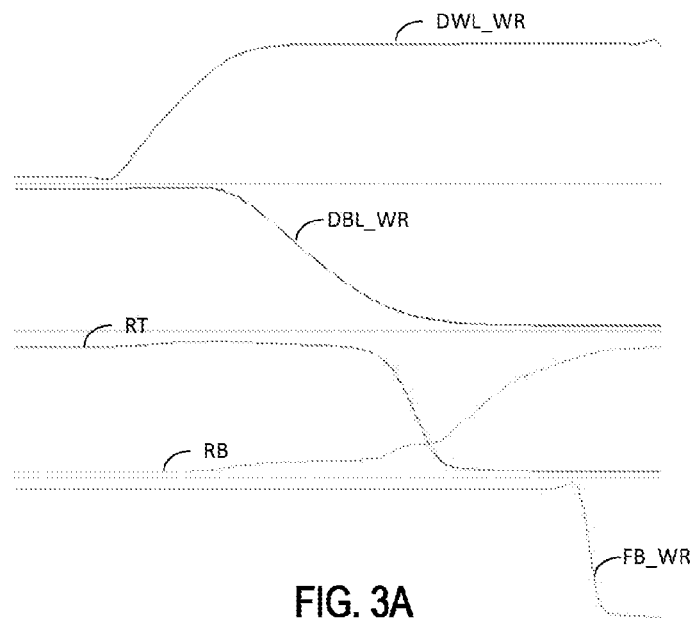
FIG. 3A and FIG. 3B are comparison graphs of simulation results of a dummy memory cell without a write operation failure of the write tracking circuits of FIG. 1 and FIG. 2, respectively.
Figure 3B:
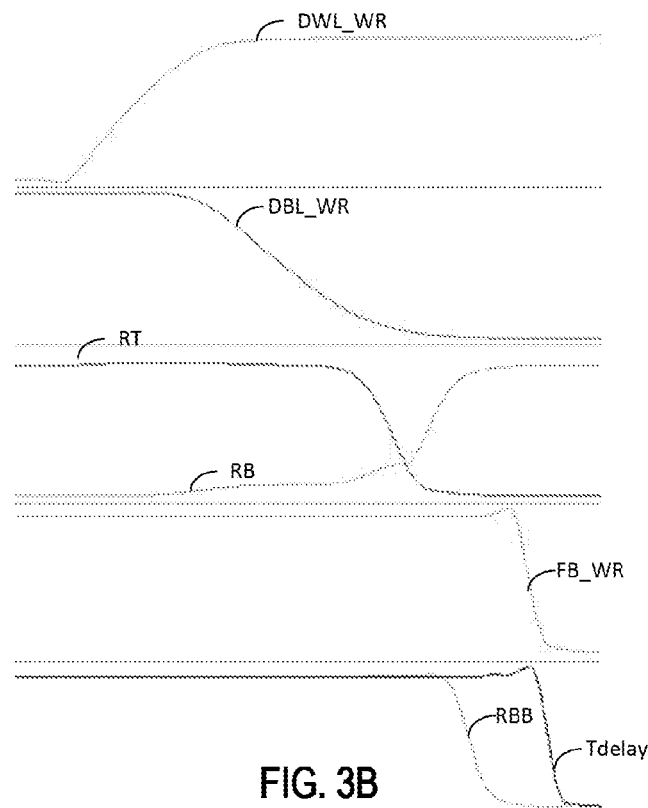
Figure 4A:
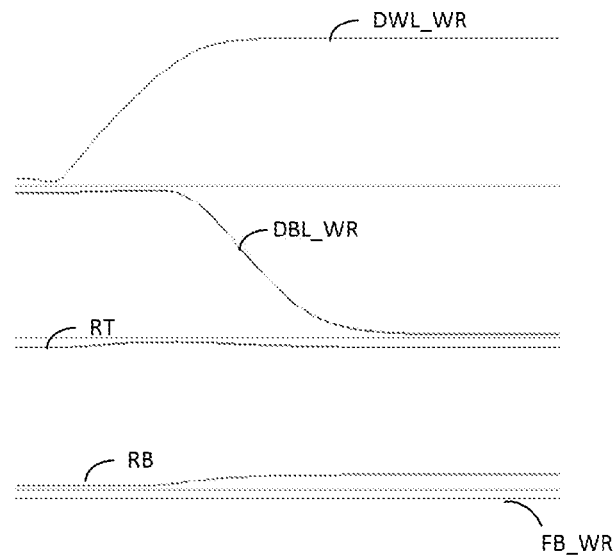
FIG. 4A and FIG. 4B are comparison graphs of simulation results of a dummy memory cell with a write operation failure of the write tracking circuits of FIG. 1 and FIG. 2, respectively.
Figure 4B:
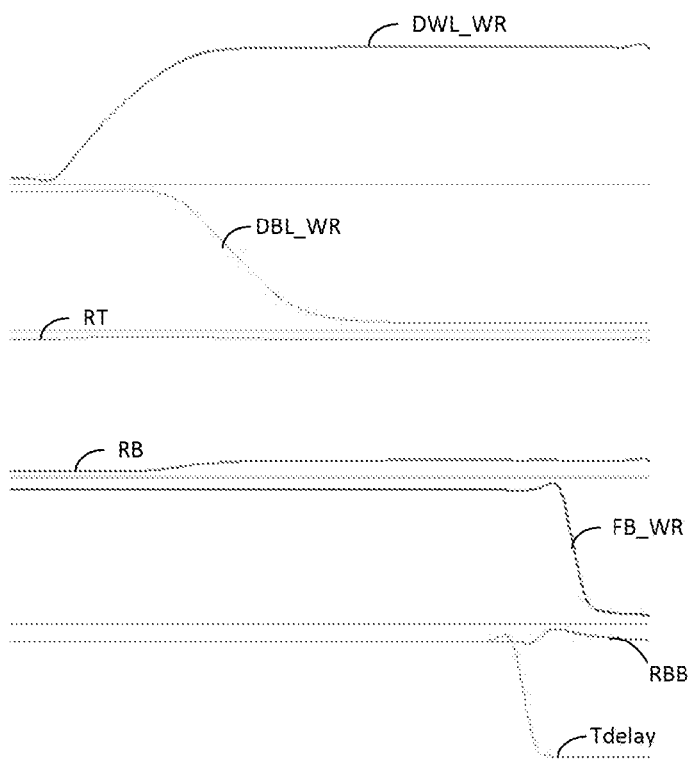

Based on the above description, the write tracking circuit according to the present invention can provide a correct feedback signal to the clock generation module in the case that there is a write operation failure to the dummy cell, thereby ensuring the normal operation of the peripheral circuit. FIGS. 3A and 3B are respective simulation results illustrating the dummy cell of FIGS. 1 and 2 without a write operation failure. FIGS. 4A and 4B are respective simulation results illustrating the dummy cell of FIGS. 1 and 2 when a write operation has failed.

Referring to FIGS. 3A and 3B, when there is no write operation failure in the dummy cell, when the dummy word line DWL is open, a "0" is written to the dummy cell, the storage nodes RT/RB of the write tracking circuit in FIGS. 1 and 2 change their logic state (flip), the feedback signal FB_WR transitions from high to low.

Referring to FIGS. 4A and 4B, under the minimum operating voltage Vccmin condition, when the storage nodes RT/RB of the write tracking circuit in FIGS. 1 and 2 cannot correctly change their logic state, the feedback signal FB_WR of the conventional write tracking circuit 100 of FIG. 1 remains high, causing an incorrect feedback signal FB_WR to supply to the clock generation module. According to the write feedback circuit 200 of FIG. 2, the signal FB_WR is the result of the logic operation of the feedback signal Tdelay and the RBB outputted by the first inverter inv1. Thus, due to the write feedback signal Tdelay, the feedback signal FB_WR transitions from high to low to ensure normal operation of the peripheral circuit.

Thus, the write tracking circuit according to the present invention can provide a correct feedback signal to the clock generator module to ensure the normal operation of the peripheral circuit, even if there is a write operation failure in the dummy cell.

Embodiments of the present invention also provide a memory including the above-described write tracking circuit. Specifically, the write tracking circuit includes a dummy memory bit cell and a delay unit connected to the dummy memory bit cell at a storage node. The dummy cell is coupled to a first dummy bit line, a second dummy bit line, and a dummy word line. A write feedback signal that serves as a delay element is introduced. The write feedback signal is generated based on a result of a logic operation between a signal on the dummy word line and a signal on the first dummy bit line of the dummy memory dummy cell. The delay of the path of the generated write feedback signal is made larger than the tracking time duration of the dummy cell.

In one embodiment of the present invention, the delay unit may include a first inverter, a first logic unit, and a second inverter. The storage node is connected to the input terminal of the first inverter; the output terminal of the first inverter is connected to a first input terminal of the first logic unit, the feedback signal is applied to a second input terminal of the first logic unit; the output terminal of the first logic unit is connected to the input terminal of the second inverter, and the output terminal of the second inverter outputs the feedback signal of the write tracking circuit.

In one embodiment, the delay unit may also include a second logic unit and a sub-delay unit. The second logic unit has first and second input terminals connected to the dummy word line and the first dummy bit line, respectively. The second logic unit has an output terminal connected to the input terminal of the sub-delay unit. The sub-delay unit outputs the write feedback signal at its output terminal.

In one embodiment, the sub-delay unit may include a number of series-connected inverters. The number of series-connected inverters can be chosen based on system requirements.

In one embodiment, the first logic unit and the second logic unit each are NAND gates.

In one embodiment, the dummy memory bit cell may include a pair of cross-coupled inverters having a first storage node and a second storage node, a first pass transistor operatively connected to the first storage node, and a second pass transistor operatively connected to the second storage node.

In one embodiment, the dummy cell is connected to the first dummy bit line through the first pass transistor and to the second dummy bit line through the second pass transistor. The first and second pass transistors are controlled by the dummy word line.

In one embodiment, the write tracking circuit may further include a test unit configure to determine a write failure of the dummy cell. In an exemplary embodiment, the test unit includes a logic NOR gate having a first input terminal connected the first input terminal of the first logic unit and a second input terminal connected the second input terminal of the first logic unit. The test unit outputs a test signal indicating whether a write failure has occurred in the dummy cell.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A circuit comprising:
   a dummy memory cell coupled to a first dummy bit line, a second dummy bit line, and a dummy word line;
   a logic operation unit coupled to the dummy word line and to the first dummy bit line and configured to output a write feedback signal based on a logic operation of a signal on the dummy word line and a signal on the first dummy bit line; and
   a delay unit coupled to the dummy memory cell at a storage node.

2. The circuit of claim 1, wherein the delay unit comprises:
   a first inverter having an input terminal coupled to the storage node and an output terminal;
   a first logic unit having a first input terminal coupled to the output terminal of the first inverter, a second input terminal for receiving the write feedback signal, and an output terminal; and
   a second inverter having an input terminal coupled to the output terminal of the first logic unit and an output terminal for outputting a feedback signal.

3. The circuit of claim 2, wherein the logic operation unit comprises:
   a second logic unit having a first input terminal coupled to the dummy word line, a second input terminal coupled to the first dummy bit line, and an output terminal for outputting an operation signal based on a logic operation of the signal on the dummy word line and the signal on the first dummy bit line; and
   a sub-delay unit having an input terminal for receiving the operation signal and an output terminal for outputting the write feedback signal.

4. The circuit of claim 3, wherein the sub-delay unit comprises a plurality of series-connected inverters.

5. The circuit of claim 4, wherein the plurality of series-connected inverters comprises even-number CMOS standard inverters.

6. The circuit of claim 3, wherein each of the first and second logic units is a NAND gate.

7. The circuit of claim 1, wherein the dummy memory cell comprises:
   a pair of cross-coupled inverters having a first storage node and a second storage node;
   a first pass transistor operatively coupled to the first storage node; and
   a second pass transistor operatively coupled to the second storage node, the second storage node being the storage node to which the delay unit is connected to the dummy memory cell.

8. The circuit of claim 7, wherein the dummy memory cell is coupled to the first dummy bit line through the first pass transistor and to the second dummy bit line through the second pass transistor, and the first and second pass transistors are controlled by the dummy word line.

9. The circuit of claim 2, further comprising a test unit configured to determine a write operation state of the dummy memory cell.

10. The circuit of claim 9, wherein the test circuit comprises a NOR gate having first and second input terminals coupled to the first and second input terminals of the first logic unit.

11. A memory comprising:
    a write tracking circuit, wherein the write tracking circuit comprises:
    a dummy memory cell coupled to a first dummy bit line, a second dummy bit line, and a dummy word line;
    a logic operation unit coupled to the dummy word line and to the first dummy bit line and configured to output a write feedback signal based on a logic operation of a signal on the dummy word line and a signal on the first dummy bit line; and
    a delay unit coupled to the dummy memory cell at a storage node.

12. The memory of claim 11, wherein the delay unit comprises:
    a first inverter having an input terminal coupled to the storage node and an output terminal;
    a first logic unit having a first input terminal coupled to the output terminal of the first inverter, a second input terminal for receiving the write feedback signal, and an output terminal; and
    a second inverter having an input terminal coupled to the output terminal of the first logic unit and an output terminal for outputting a feedback signal.

13. The memory of claim 12, wherein the logic operation unit comprises:
    a second logic unit having a first input terminal coupled to the dummy word line, a second input terminal coupled to the first dummy bit line, and an output terminal for outputting an operation signal based on a logic operation of the signal on the dummy word line and the signal on the first dummy bit line; and
    a sub-delay unit having an input terminal for receiving the operation signal and an output terminal for outputting the write feedback signal.

14. The memory of claim 13, wherein the sub-delay unit comprises a plurality of series-connected inverters.

15. The memory of claim 13, wherein the sub-delay unit comprises one or more capacitive delay elements connected between two series-connected inverters.

16. The memory of claim 13, wherein each of the first and second logic units is a NAND gate.

17. The memory of claim 11, wherein the dummy memory cell comprises:
    a pair of cross-coupled inverters having a first storage node and a second storage node;

a first pass transistor operatively coupled to the first storage node; and a second pass transistor operatively coupled to the second storage node, the second storage node being the storage node to which the delay unit is connected to the dummy memory cell.

18. The memory of claim 17, wherein the dummy memory cell is coupled to the first dummy bit line through the first pass transistor and to the second dummy bit line through the second pass transistor, and the first and second pass transistors are controlled by the dummy word line.

19. The memory of claim 12, further comprising a test unit configured to determine a write operation state of the dummy memory cell.

20. The memory of claim 19, wherein the test circuit comprises a NOR gate having first and second input terminals coupled to the first and second input terminals of the first logic unit.

* * * * *